United States Patent
Lu

(10) Patent No.: US 10,529,664 B2
(45) Date of Patent: Jan. 7, 2020

(54) ELECTRONIC DEVICE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/985,472

(22) Filed: May 21, 2018

(65) Prior Publication Data
US 2019/0355664 A1 Nov. 21, 2019

(51) Int. Cl.
*H01L 23/532* (2006.01)
*H01L 23/00* (2006.01)

(52) U.S. Cl.
CPC ........ *H01L 23/5329* (2013.01); *H01L 23/562* (2013.01); *H01L 24/13* (2013.01); *H01L 2224/13147* (2013.01)

(58) Field of Classification Search
None
See application file for complete search history.

(56) References Cited

U.S. PATENT DOCUMENTS

| | | | |
|---|---|---|---|
| 6,614,091 B1 * | 9/2003 | Downey | H01L 24/03 257/499 |
| 8,076,177 B2 | 12/2011 | Chen et al. | |
| 8,237,273 B2 | 8/2012 | Hsu et al. | |
| 8,525,278 B2 * | 9/2013 | Chu | H01L 24/81 257/415 |
| 9,129,963 B1 * | 9/2015 | Yang | H01L 23/5226 |

* cited by examiner

*Primary Examiner* — Chandra Chaudhari
(74) *Attorney, Agent, or Firm* — Foley & Lardner LLP; Cliff Z. Liu

(57) ABSTRACT

An electronic device includes a first substrate, a first conductor, a first insulation layer, a second substrate, a second conductor, a second insulation layer. The first substrate has a first surface. The first conductor is disposed on the first surface of the first substrate. The first insulation layer is on the first conductor. The second substrate has a second surface facing toward the first surface of the first substrate. The second conductor is disposed on the second surface of the second substrate. The second insulation layer is on the second conductor. The first insulation layer is in contact with a sidewall of the second conductor. The second insulation layer is in contact with a sidewall of the first conductor. A coefficient of thermal expansion (CTE) of the first insulation layer is greater than a CTE of the first conductor.

20 Claims, 23 Drawing Sheets

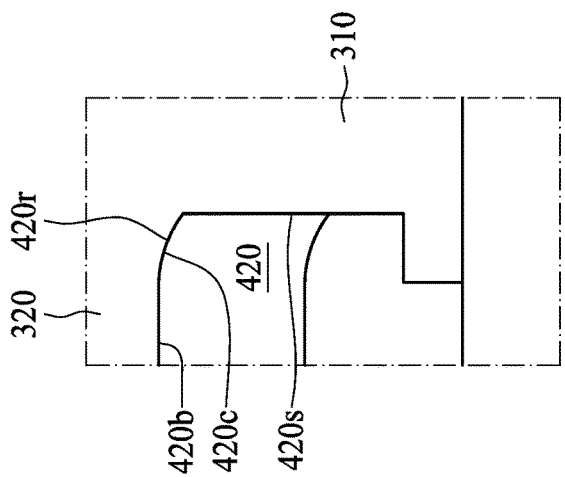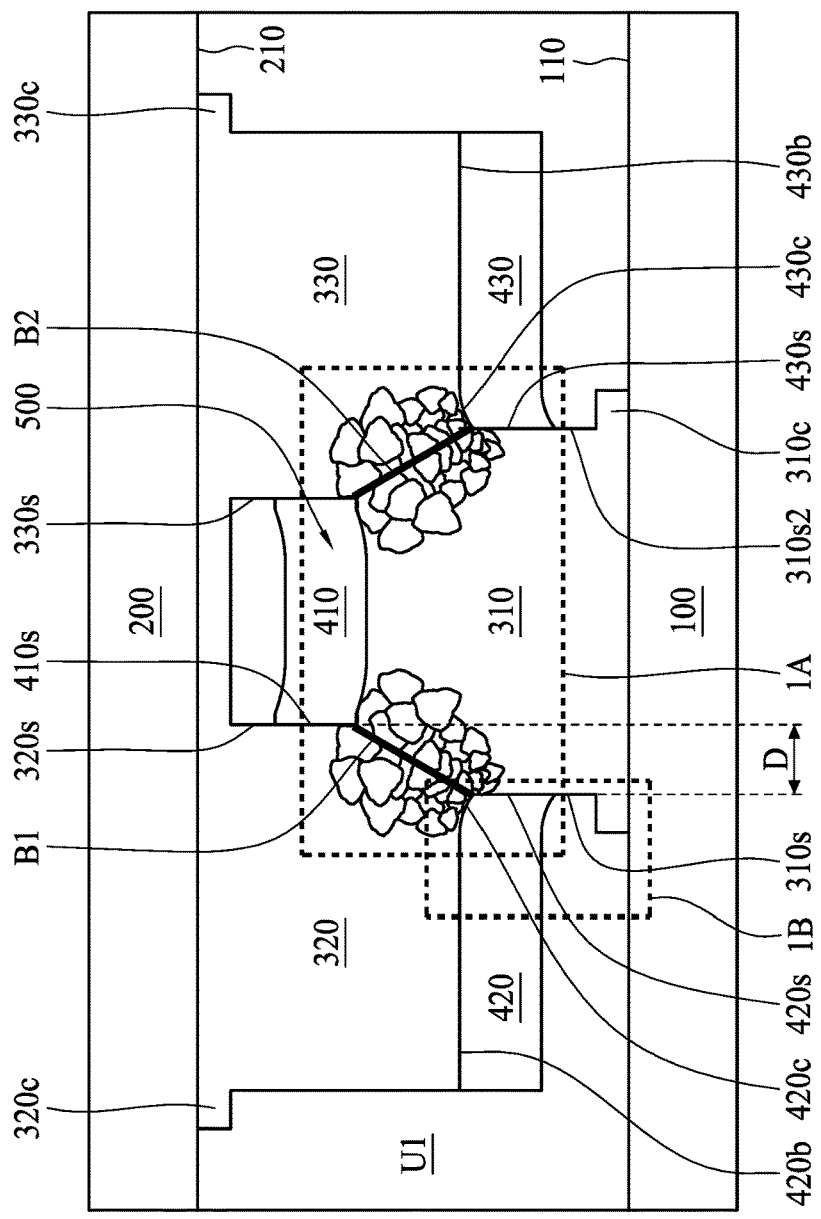

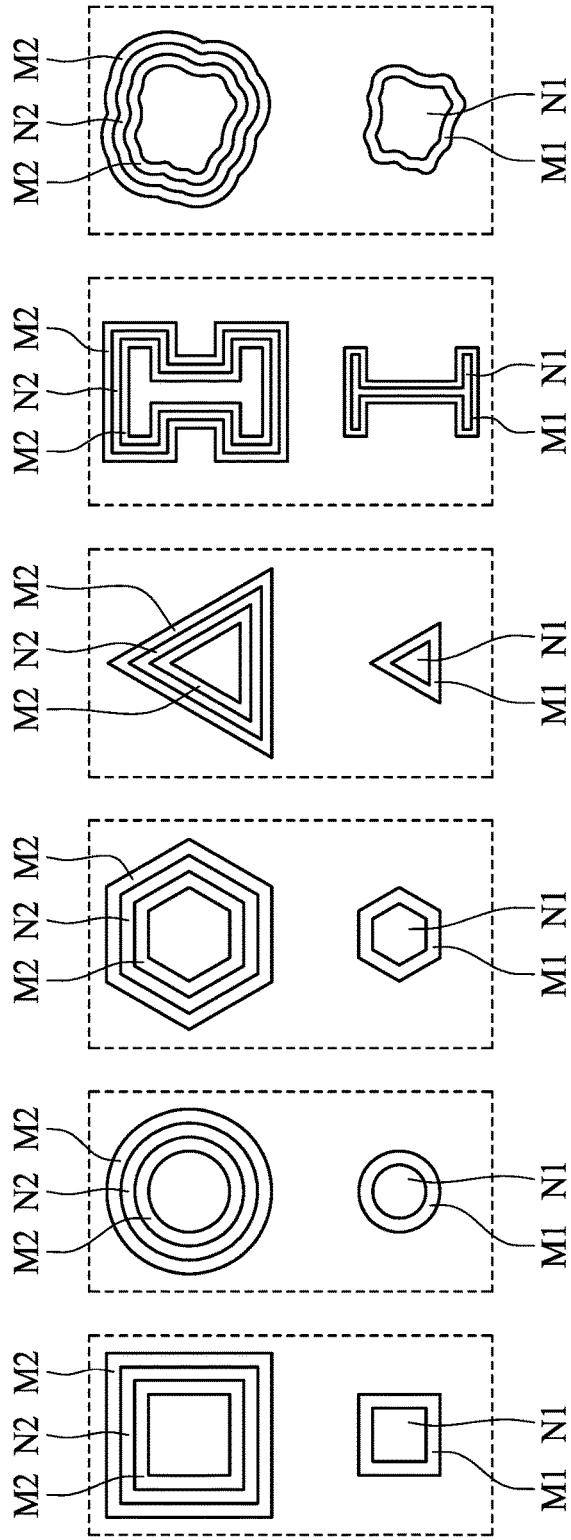
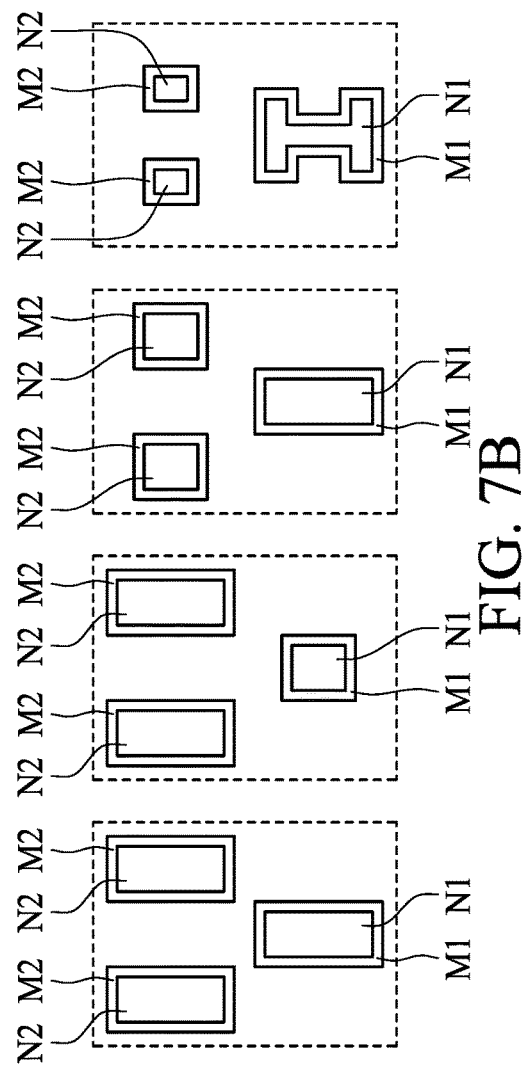
FIG. 7A
FIG. 7B

ELECTRONIC DEVICE AND METHOD OF MANUFACTURING THE SAME

BACKGROUND

1. Technical Field

The present disclosure relates generally to an electronic device and a method of manufacturing the same. More particularly, the present disclosure relates to an electronic device including a conductive pillar or a conductor and a method of manufacturing the same.

2. Description of the Related Art

Copper (Cu) to Cu bonding technology has become one of key technologies in the semiconductor industry, for example, in the field of three dimensional (3D) integration or packaging. One advantage of Cu to Cu bonding technology is that it does not require additional solder between Cu bonding surfaces, such as between Cu pillars or pads, so there is no inter-metallic compound (IMC) generated in the bonding junction, and the issue of decreased electrical performance caused by excessive IMC may be reduced.

However, current Cu to Cu bonding technology specifies high temperature (for example, greater than 250° C.) and high pressure (for example, greater than 10 Mpa), which results in a high cost. High temperature may cause warpage issue for the objects (for example, a die or an organic substrate) to be bonded, thus resulting in poor connectivity. Furthermore, current Cu to Cu bonding usually takes more than 10 minutes, which, given the condition of a high temperature, may cause electrical problems due to undesired electron migration or variation in electron doping concentration.

SUMMARY

In one or more embodiments, an electronic device includes a first substrate, a first conductor, a first insulation layer, a second substrate, a second conductor, a second insulation layer. The first substrate has a first surface. The first conductor is disposed on the first surface of the first substrate. The first insulation layer is on the first conductor. The second substrate has a second surface facing toward the first surface of the first substrate. The second conductor is disposed on the second surface of the second substrate. The second insulation layer is on the second conductor. The first insulation layer is in contact with a sidewall of the second conductor. The second insulation layer is in contact with a sidewall of the first conductor. A coefficient of thermal expansion (CTE) of the first insulation layer is greater than a CTE of the first conductor.

In one or more embodiments, an electronic device includes a first conductive post, a first insulation layer, a second conductive post, a second insulation layer, and a third conductive post. The first insulation layer is disposed on the first conductive post. The second conductive post is adjacent to the first conductive post. The second conductive post and the first conductive post define a gap therebetween. A second insulation layer is disposed on the second conductive post. The third conductive post is disposed within the gap and in contact with a sidewall of the first conductive post and/or a sidewall of the second conductive post. A CTE of the first insulation layer is greater than a CTE of the first conductive post.

In one or more embodiments, a method of manufacturing an electronic device includes providing a first substrate having a first surface, placing a first conductor on the first surface of the first substrate, providing a second substrate having a second surface facing toward the first surface of the first substrate, placing a second conductor and a third conductor on the second surface of the second substrate, the second conductor and the third conductor defining a space, disposing a first insulation layer on the second conductor and a second insulation layer on the third conductor, providing a first temperature such that a width of the first conductor is smaller than the space, and inserting the first conductor into the space.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 1A illustrates a cross-sectional view of a connection structure in accordance with some embodiments of the present disclosure.

FIG. 1B illustrates an enlarged view of a portion of the connection structure in FIG. 1A.

FIG. 7A and FIG. 7B illustrate various arrangements of conductors to be bonded from a top view perspective, in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1C:
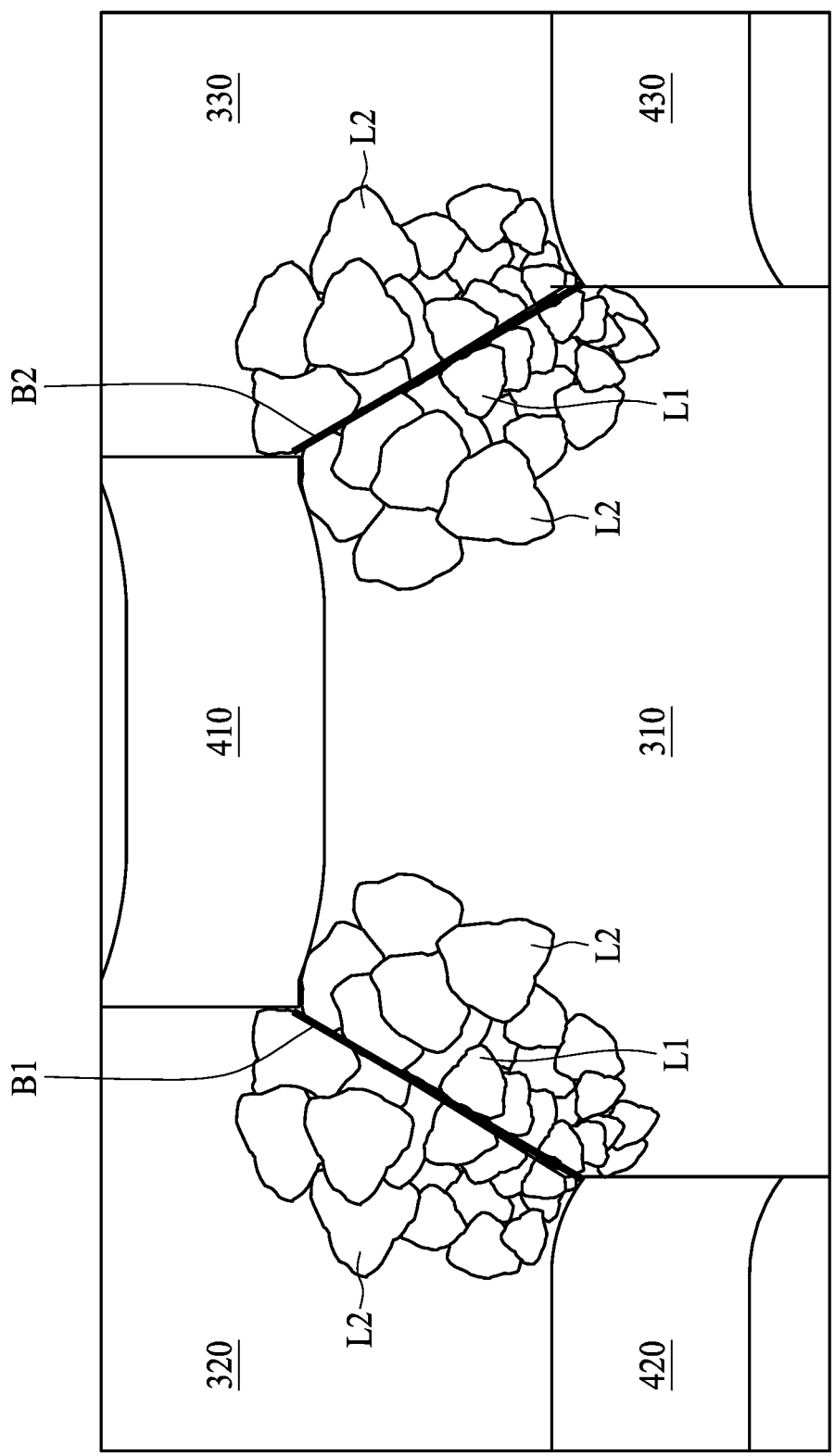
FIG. 1C illustrates an enlarged view of a portion of the connection structure in FIG. 1A.

Structures, manufacturing and use of the embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the drawings are disclosed below using specific language. It will nevertheless be understood that the embodiments or examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

The present disclosure provides an electronic device and a method of manufacturing the electronic device, wherein conductor to conductor (for example, Cu to Cu) bonding may be realized under a low temperature that may be lower than 0° C., thus preventing the above mentioned problems that may be caused by a high temperature bonding condition. In some embodiments, the low temperature bonding may be realized by a design or a method that conductors that are to be bonded are attached or combined with insulation layers that have higher coefficient of thermal expansion (CTE) than the conductors. Low-temperature bonding also can save cost.

FIG. 1A illustrates a cross-sectional view of a connection structure 10 in accordance with some embodiments of the present disclosure. As shown in FIG. 1A, the connection structure 10 may include a first substrate 100, a second substrate 200, a first conductor 310, a second conductor 320, a third conductor 330, a first insulation layer 410, a second insulation layer 420, and a third insulation layer 430. An underfill U1 may be filled between the first substrate 100 and the second substrate 200. In some embodiments, the connection structure 10 may be realized by a low temperature conductor to conductor (for example, Cu to Cu) bonding process. In some embodiments, the connection structure 10 may include an interconnect structure. In some embodiments, the connection structure 10 may include a 3D packaging structure.

The first substrate 100 includes a first surface 110. In some embodiments, the first substrate 100 is fabricated with a predetermined functional circuit thereon. In some embodiments, the first substrate 100 includes several conductive lines and several electrical components such as a transistor, a diode, or other electrical component connected by the conductive lines. In some embodiments, the first substrate 100 is an interposer or a wafer. In some embodiments, the first substrate 100 may be a printed circuit board (PCB). In some embodiments, the first substrate 100 includes material such as ceramic, glass, organic, etc.

As shown in FIG. 1A, the first conductor 310 may be disposed on the first surface 110 of the first substrate 100. In some embodiments, there may be a conductive layer 310c (for example, a seed layer or a plating layer) between the substrate 100 and the first conductor 310. In some embodiments, a CTE of the first conductor 310 is between about 16 ppm/° C. to about 18 ppm/° C. In some embodiments, the first conductor 310 may be a conductive post, a conductive pillar or a conductive pad. In some embodiments, the first conductor 310 may include gold, silver, copper, nickel, tungsten, aluminum, titanium, palladium and/or alloys thereof. In some embodiments, the first connector 310 may have a cylindrical, hemispherical or spherical shape.

The first insulation layer 410 is disposed on the first conductor 310. The first insulation layer 410 may be disposed on a surface of the first conductor 310 that faces toward the second substrate 200. The first insulation layer 410 may be in contact with the first conductor 310. The first insulation layer 410 may be or include a passivation layer or a dielectric layer. In some embodiments, a CTE of the first insulation layer 410 is greater than the CTE of the first conductor 310. For example, the CTE of the first insulation layer 410 is between about 50 ppm/° C. to about 400 ppm/° C. In some embodiments, the CTE of the first insulation layer 410 is between about 60 ppm/° C. to about 100 ppm/° C. In some embodiments, a ratio of the CTE of the first insulation layer 410 to the CTE of the first conductor 310 is between about 3 to about 7. In some embodiments, the CTE difference between the first insulation layer 410 and the first conductor 310 may be utilized during a low temperature bonding process (explained below) in manufacturing the connection structure 10. In some embodiments, the first insulation layer 410 may include polyimide. In some embodiments, the first insulation layer 410 may include polyethylene or polypropylene.

The second substrate 200 is disposed over the first substrate 100 and/or the first conductor 310. The second substrate 200 has a second surface 210 facing toward the first surface 110 of the first substrate 100. In some embodiments, a gap or a distance between the first substrate 100 and the second substrate 200 (e.g., between the first surface 110 of the first substrate 100 and the second surface 210 of the second substrate 200) may be about 30 μm to 300 μm. In some embodiments, the second substrate 200 may have similar properties with the first substrate 100.

As shown in FIG. 1A, the second conductor 320 may be disposed on the second surface 210 of the second substrate 200. In some embodiments, there may be a conductive layer 320c (for example, a seed layer or a plating layer) between the substrate 200 and the second conductor 320. In some embodiments, a CTE of the second conductor 320 is between about 16 ppm/° C. to about 18 ppm/° C. In some embodiments, the second conductor 320 may be a conductive post, a conductive pillar or a conductive pad. In some embodiments, the second conductor 320 may have similar properties with the first conductor 310.

The second insulation layer 420 is disposed on the second conductor 320. The second insulation layer 420 may be disposed on a surface of the second conductor 320 that faces toward the first substrate 100. The second insulation layer 420 may be in contact with the second conductor 320. The second insulation layer 420 may include a passivation layer or a dielectric layer. In some embodiments, a CTE of the second insulation layer 420 is greater than the CTE of the second conductor 320. For example, the CTE of the second insulation layer 420 is between about 50 ppm/° C. to about 400 ppm/° C. For example, the CTE of the second insulation layer 420 is between about 60 ppm/° C. to about 100 ppm/° C. In some embodiments, a ratio of the CTE of the second insulation layer 420 to the CTE of the second conductor 320 is between about 3 to about 7. In some embodiments, the CTE difference between the second insulation layer 420 and the second conductor 320 may be utilized during a low temperature bonding process (explained below) in manufacturing the connection structure 10. In some embodiments, the second insulation layer 420 may include polyimide. In some embodiments, the second insulation layer 420 may have similar properties with the first insulation layer 410.

The third conductor 330 may be disposed on the second surface 210 of the second substrate 200. In some embodiments, there may be a conductive layer 330c (for example, a seed layer or a plating layer) between the substrate 200 and the third conductor 330. In some embodiments, the conductive layer 330c may be connected with the conductive layer 320c. Alternatively, the conductive layer 330c may be insulated from the conductive layer 320c. As shown in FIG. 1A, the third conductor 330 may be disposed adjacent to the second conductor 320. The second conductor 320 and the third conductor 330 may be separated from each other and define a gap 500 (or a space) therebetween. In some embodiments, a CTE of the third conductor 330 is between about 16 ppm/° C. to about 18 ppm/° C. In some embodiments, the third conductor 330 may be a conductive post, a conductive pillar or a conductive pad. In some embodiments, the third conductor 330 may have similar properties with the first conductor 310 or the second conductor 320.

The third insulation layer 430 is disposed on the third conductor 330. The third insulation layer 430 may be disposed on a surface of the third conductor 330 that faces toward the first substrate 100. The third insulation layer 430 may be in contact with the third conductor 330. The third insulation layer 430 may include a passivation layer or a dielectric layer. In some embodiments, a CTE of the third insulation layer 430 is greater than the CTE of the third conductor 330. In some embodiments, the CTE of the third insulation layer 430 is between about 50 ppm/° C. to about 400 ppm/° C. In some embodiments, the CTE of the third insulation layer 430 is between about 60 ppm/° C. to about 100 ppm/° C. In some embodiments, a ratio of the CTE of the third insulation layer 430 to the CTE of the third conductor 330 is between about 3 to about 7. In some embodiments, the CTE difference between the third insulation layer 430 and the third conductor 330 may be utilized during a low temperature bonding process (explained below) in manufacturing the connection structure 10. In some embodiments, the third insulation layer 430 may include polyimide. In some embodiments, the third insulation layer 430 may have similar properties with the first insulation layer 410 or the second insulation layer 420.

As shown in FIG. 1A, the first conductor 310 may be disposed between the second conductor 320 and the third conductor 330, or between the second insulation layer 420 and the third insulation layer 430. For example, the first conductor 310 may be disposed within the gap 500 defined by the second conductor 320 and the third conductor 330. In some embodiments, the first conductor 310 may be in contact with a sidewall 320s of the second conductor 320 and/or a sidewall 330s of the third conductor 330. In some embodiment, the first insulation layer 410 may be disposed between the second conductor 320 and the third conductor 330. For example, the first insulation layer 410 may be disposed within the gap 500 defined by the second conductor 320 and the third conductor 330. In some embodiments, the first insulation layer 410 may be in contact with the sidewall 320s of the second conductor 320 and/or the sidewall 330s of the third conductor 330. In some embodiments, the first insulation layer 410 is spaced apart from the second surface 210 of the second substrate 200, the conductive layer 320c or the conductive layer 330c. Alternatively, the first insulation layer 410 may be in contact with the second surface 210 of the second substrate 200, the conductive layer 320c or the conductive layer 330c. In some embodiments, the second insulation layer 420 or the third insulation layer 430 is spaced apart from the first surface 110 of the first substrate 100 or the conductive layer 310c. Alternatively, the second insulation layer 420 or the third insulation layer 430 may be in contact with the first surface 110 of the first substrate 100 or the conductive layer 310c.

In some embodiments, the first insulation layer 410 has a sidewall 410s (or a first surface) in contact with the second conductor 320, the second insulation layer 420 has a sidewall or a surface 420s (or a second surface) in contact with the first conductor 310, and an extension of the sidewall 410s of the first insulation layer 410 and an extension of the sidewall 420s of the second insulation layer 420 are substantially parallel and a distance D therebetween is in a range from about 2 μm to about 20 μm. In some embodiments, from a top view perspective, the first conductor 310 and the second conductor 320 (or the third conductor 330) may define an overlapping portion in a range from about 2 μm to about 20 μm. In some embodiments, the overlapping portion may be about the same as the distance D. In other embodiments, the overlapping portion may be different from the distance D, for example, the overlapping portion may be larger than the distance D.

FIG. 1B illustrates an enlarged view of a portion of the connection structure 10 in FIG. 1A circled by a dotted-line rectangle 1A. As shown in FIGS. 1A and 1B, the surface 420s of the second insulation layer 420 may be in contact with a sidewall (for example, the sidewall 310s) of the first conductor 310, and the second insulation layer 420 may have a surface 420b in contact with the second conductor 320 and a surface 420c connecting the surface 420s and the surface 420b. In some embodiments, the surface 420c may have a curve portion or a round portion 420r. The curve portion 420r may be resulted by a compression force between the first conductor 310 and the second conductor 320 or the second insulation layer 420. The curve portion 420r may be resulted by the first conductor 310 and the second conductor 320 or the second insulation layer 420 compressing each other due to expansion of the first conductor 310, the second conductor 320 or the second insulation layer 420 during a manufacturing process of the connection structure 10, for example, during a process of recovering to room temperature from a low temperature that may be lower than 0° C. Similarly, in some embodiments, the third insulation layer 430 may have a surface 430s in contact with the first conductor 310, a surface 430b in contact with the third conductor 330, and a surface 430c connecting the surface 430s and the surface 430b. The surface 430c may have a curve portion or a round portion that may be resulted by a compression force between the first conductor 310 and the third conductor 330 or the third insulation layer 430. In some embodiments, the curve portion of the surface 430c may be resulted by similar or same mechanism as described above for the curve portion 420r.

FIG. 1C illustrates an enlarged view of a portion of the connection structure 10 in FIG. 1A circled by a dotted-line rectangle 1B. Referring to FIGS. 1A and 1C, a boundary B1 may be formed between the first conductor 310 and the second conductor 320, and a boundary B2 may be formed between the first conductor 310 and the third conductor 330. The boundary B1 may be defined by a part of the sidewall 310s of the first conductor 310 and a part of the sidewall 320s of the second conductor 320. The boundary B2 may be defined by a part of a sidewall 310s2 of the first conductor 310 and a part of the sidewall 330s of the third conductor 330. In some embodiments, as shown in FIG. 1C, a lattice L1 (for example, a crystal lattice of the conductors 310, 320 or 330) in the vicinity of the boundary B1 or B2 is smaller than a lattice L2 (for example, a crystal lattice of the conductors 310, 320 or 330) away from the boundary B1 or B2. The difference in lattice size may be resulted by different compression forces. For example, a portion in the vicinity of the boundary B1 may suffer a greater compression force than another portion away from the boundary B1 during a manufacturing process such as recovering to room temperature from a low temperature that may be lower than 0° C. In some embodiments, as shown in FIG. 1C, a lattice (for example, a crystal lattice of the conductors 310, 320 or 330) in the vicinity of the second insulation layer 420 is smaller than a lattice away from the second insulation layer 420. For example, a lattice adjacent to the second insulation layer 420 is smaller than a lattice adjacent to the first insulation layer 410 or a lattice at or adjacent to the middle of the boundary B1. In other embodiments, a lattice adjacent to the second insulation layer 420 or the first insulation layer 410 is smaller than a lattice at or adjacent to the middle of the boundary B1.

Figure 2:
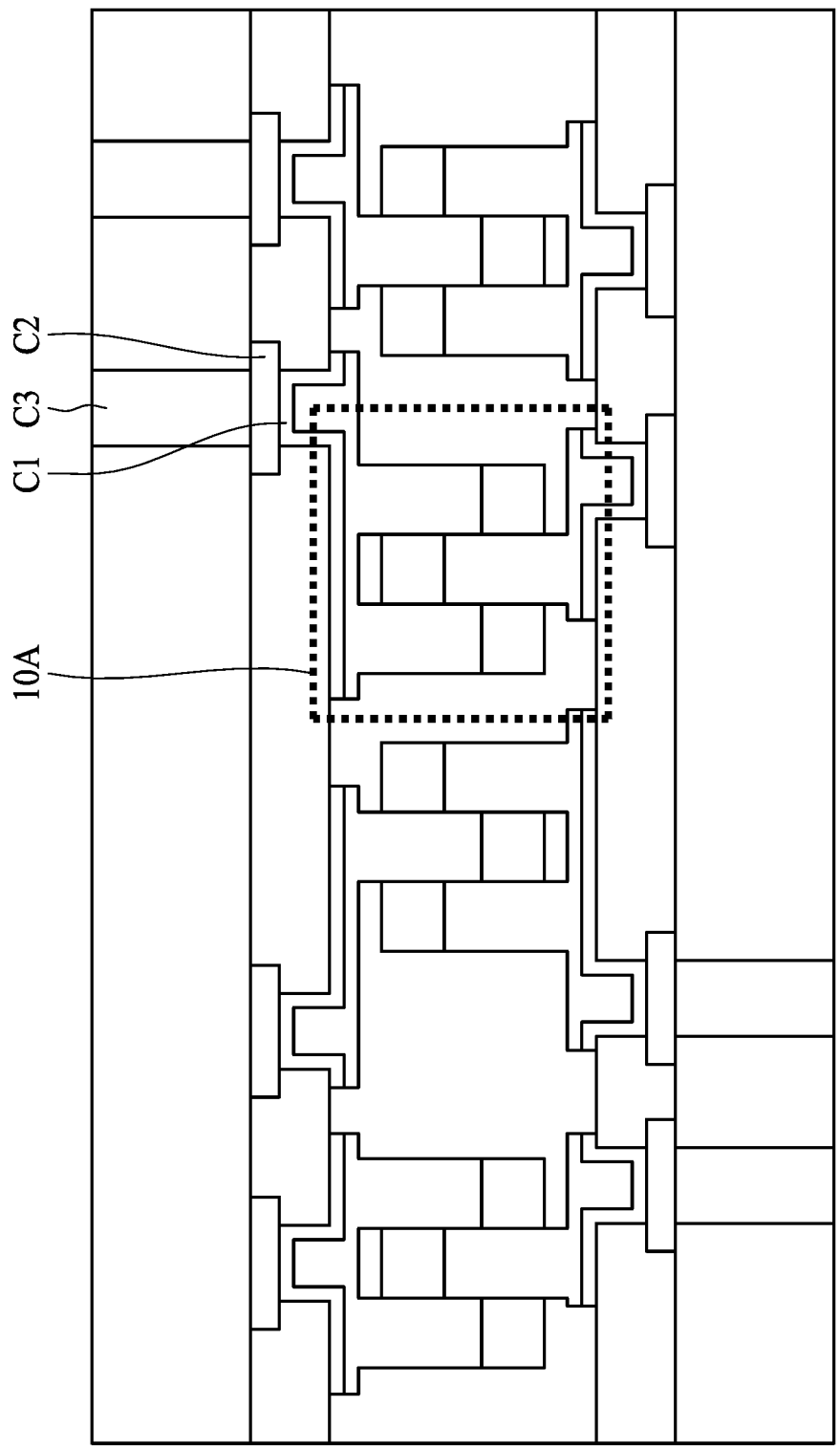
FIG. 2 illustrates an electronic apparatus in accordance with some embodiments of the present disclosure.

FIG. 2 illustrates an electronic apparatus 20 in accordance with some embodiments of the present disclosure. The electronic apparatus 20 includes a connection structure 10A. The connection structure 10A may have similar features as the connection structure 10 in FIG. 1A. In some embodiments, the connection structure 10A may function as an interconnection structure within the electronic apparatus 20, for example, the connection structure 10A may electrically connect an upper portion and a lower portion of the electronic apparatus 20. As shown in FIG. 2, the electronic apparatus 20 may further include other conductors C1, C2 or C3 that may include a conductive trace, a conductive pad or a conductive pillar. In some embodiments, conductors C1, C2 or C3 may be used for external connection for the electronic apparatus 20.

Figure 3B:
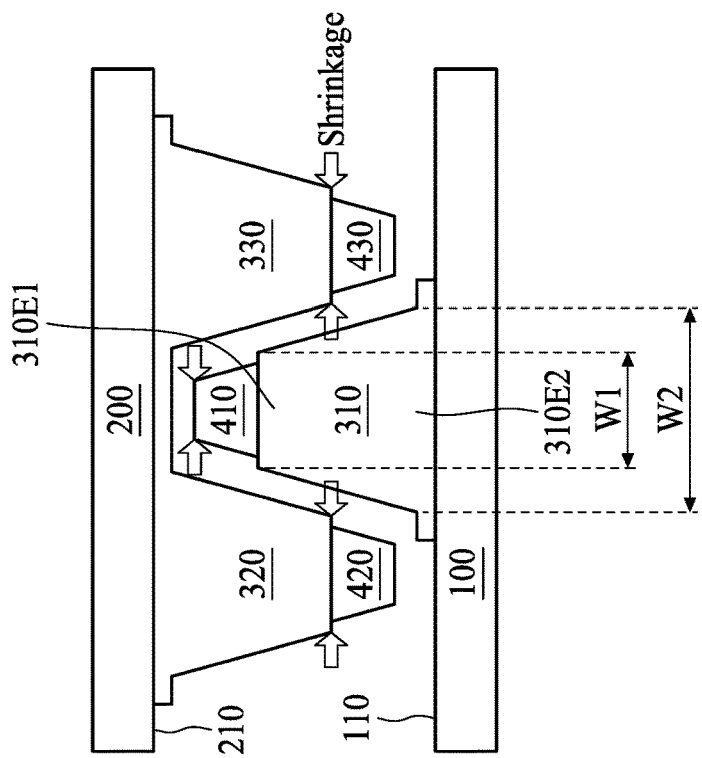
FIG. 3A, FIG. 3B, and FIG. 3C illustrate various stages of a method of manufacturing an electronic device in accordance with some embodiments of the present disclosure.
Figure 3A:
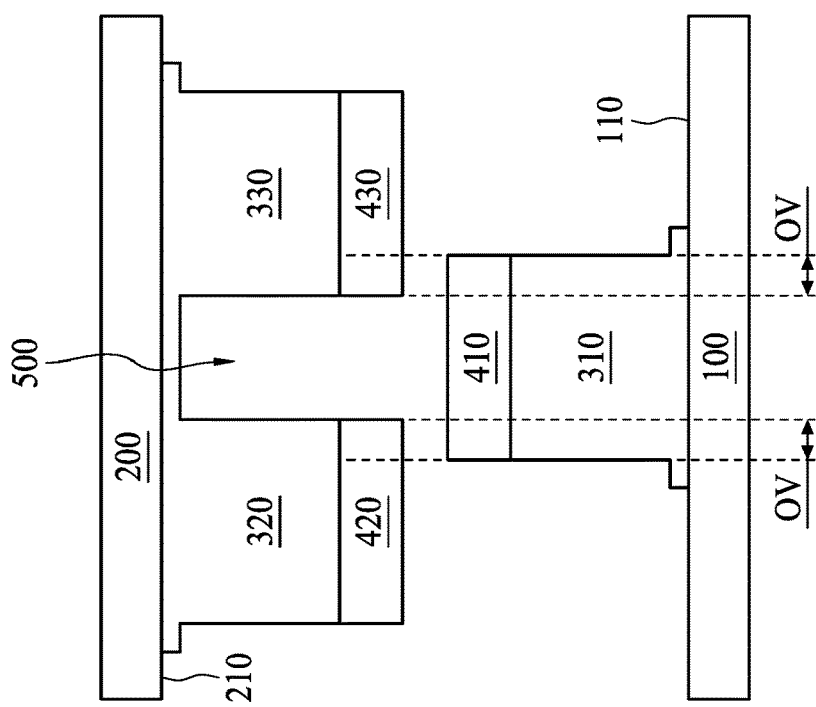
Figure 3C:
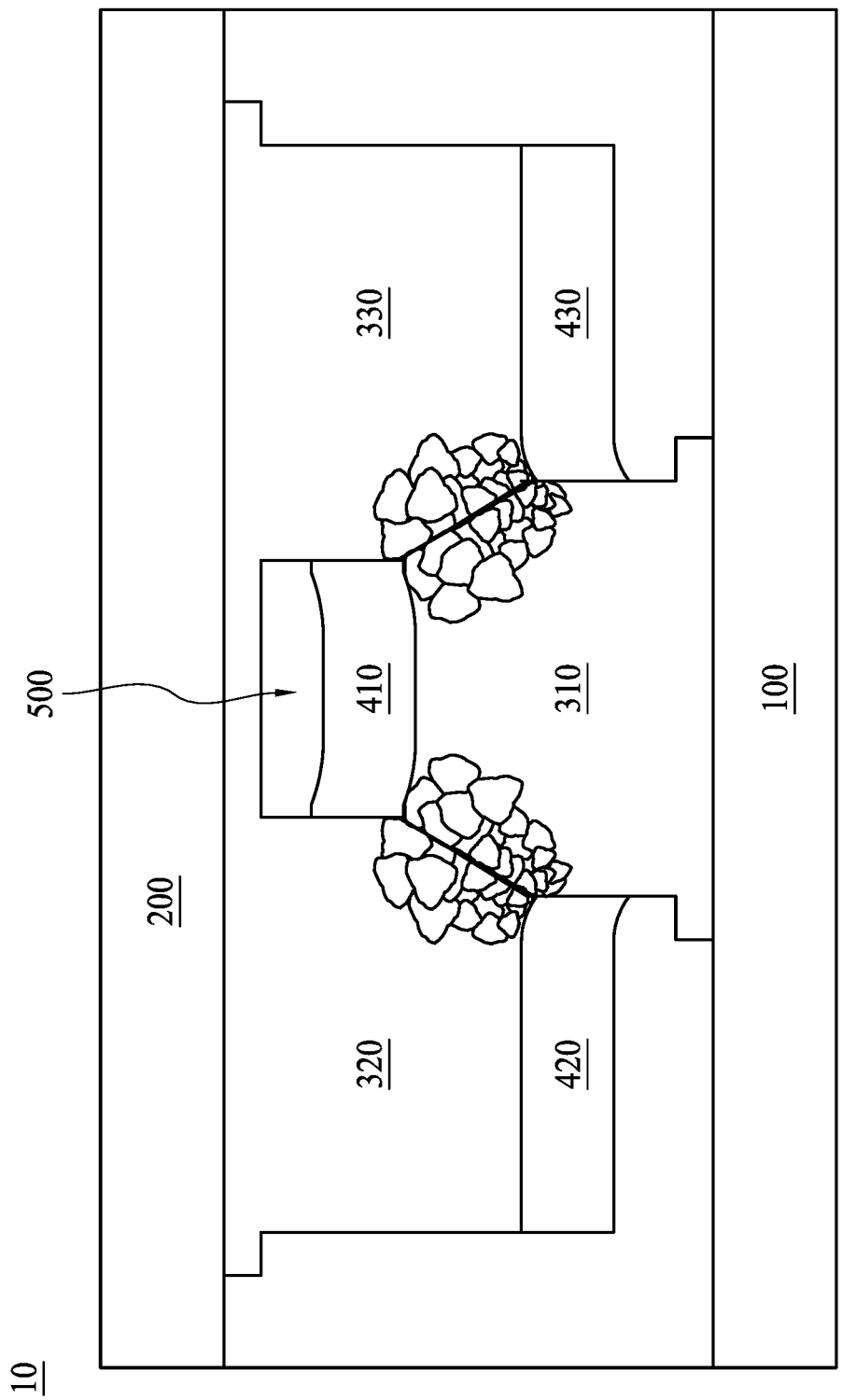

FIG. 3A, FIG. 3B and FIG. 3C illustrate various stages of a method of manufacturing a connection structure in accordance with some embodiments of the present disclosure. In some embodiments, the operations in FIGS. 3A, 3B and 3C are used to form the connection structure 10 in FIG. 1A.

Referring to FIG. 3A, a first substrate 100 having a first surface 110 is provided. A first conductor 310 may be placed or disposed on the first surface 110 of the first substrate 100. A second substrate 200 having a second surface 210 facing toward the first surface 110 of the substrate 100 is provided. A second conductor 320 and a third conductor 330 may be placed or disposed on the second surface 210 of the second substrate 200. The second conductor 320 and the third conductor 330 may be spaced apart or define a gap or a space 500 therebetween. A first insulation layer 410 may be disposed on the first conductor 310. A second insulation layer 420 may be disposed on the second conductor 320. A third insulation layer 430 may be disposed on the third conductor 330. As described above, a CTE of the first insulation layer 410 may be greater than a CTE of the first conductor 310, a CTE of the second insulation layer 420 may be greater than a CTE of the second conductor 320, and a CTE of the third insulation layer 430 may be greater than a CTE of the third conductor 330. In some embodiments, the first conductor 310 is arranged corresponding to the space 500 defined by the second conductor 320 and the third conductor 330. For example, a central line of the first conductor 310 is substantially aligned with a central line of the space 500 defined by the second conductor 320 and the third conductor 330. In some embodiments, it is aligned that the first conductor 310 and the second conductor 320 (or the third conductor 330) may have an overlapping portion OV in a range from about 2 μm to about 20 μm from a top view perspective.

In other embodiments, the second insulation layer 420 and the third insulation layer 430 can be omitted. For example, there is the first insulation layer 410 disposed on the first conductor 310 and no insulation layer is disposed on the second conductor 320 or the third conductor 330. In other embodiments, the first insulation layer 410 can be omitted. For example, there is the second insulation layer 420 or the third insulation 430 disposed on the second conductor 320 or the third conductor 330 and no insulation layer disposed on the first conductor 310.

Referring to FIG. 3B, a first temperature is provided such that a width W1 of the first conductor 310 is smaller than the gap or space 500 between the second conductor 320 and the third conductor 330. In some embodiments, the first temperature is lower than 0° C. In some embodiments, the first temperature is between about −20° C. to about −40° C. Under such a low temperature, the first insulation layer 410 has a greater shrinkage rate than that of the first conductor 310 due to a relatively higher CTE. Because the first insulation layer 410 is disposed on an end 310E1 (for example, an end facing the second substrate 200) of the first conductor 310, the end 310E1 is affected or pulled by the shrinkage of the first insulation layer 410 and has a greater shrinkage than that of the other end 310E2 (for example, an end on the first substrate 100). Therefore, a width W1 of the end 310E1 becomes smaller than a width W2 of the end 310E2 or the space 500. Similar situation or phenomenon may occur between the second insulation layer 420 and the second conductor 320, or between the third insulation layer 430 and the third conductor 330. As shown in FIG. 3B, the first conductor 310 is then moved toward the space 500 and inserted into the space 500.

Referring to FIG. 3C, after the first conductor 310 is inserted into the space 500, the first temperature is not provided. For example, the temperature may rise to a room temperature that may be higher than 0° C. Along with the temperature rise, the first conductor 310, the second conductor 320, the third conductor 330, the first insulation layer 410, the second insulation layer 420, and the third insulation layer 430 may expand from the low-temperature states in FIG. 3B. Therefore, the first conductor 310 and the second conductor 320, or the first conductor 310 and the third conductor 330 may compress or extrude with each other and be bonded with each other. The compression force may result in the lattice size distribution described above for FIGS. 1A and 1C. In some embodiments, the compression force may result in a mechanical bonding between the first conductor 310 and the second conductor 320, or between the first conductor 310 and the third conductor 330. The mechanical bonding may reserve an inner compressive stress that may lead to the above mentioned lattice size distribution during a re-crystallizing process in a subsequent high temperature process such as a reflow process. Furthermore, during the temperature rise, the second insulation layer 420 may expand and compress with or against the first conductor 310 and the second conductor 320. Or, the second insulation layer 420 may be compressed by the expanded first conductor 310 or second conductor 320. The compression force may result in the curve portion 420r described above for FIGS. 1A and 1B. The above mentioned curve portion of the surface 430c of the third insulation layer 430 may be resulted by similar mechanism. Compared with conventional Cu to Cu bonding process, the above mentioned bonding process utilizing side or lateral compression or extrusion force may give the structure more robustness against shear force. Furthermore, a process such as a dry or wet etching process may be applied to increase the roughness of a sidewall of the first conductor 310, the second conductor 320 or the third conductor 330, which may increase the friction coefficient between different conductors during or after the bonding process.

In some embodiments, the first temperature may be higher than −20° C., and the shrinkage for the first insulation layer 410 or the first conductor 310 may be not enough such that the first conductor 310 cannot be inserted into the space 500 between the second conductor 320 and the third conductor 330. In some embodiments, the first temperature may be lower than −40° C., and the adhesiveness between the first insulation layer 410 and the first conductor 310 (or between the second insulation layer 420 and the second conductor 320, or between the third insulation layer 430 and the third conductor 330) may not stand or bear the shrinkage difference (or shear strength, or shear strain) between the first insulation layer 410 and the first conductor 310 (or between the second insulation layer 420 and the second conductor 320, or between the third insulation layer 430 and the third conductor 330), such that delamination may occur between the first insulation layer 410 and the first conductor 310 (or between the second insulation layer 420 and the second conductor 320, or between the third insulation layer 430 and the third conductor 330.).

In some embodiments, a ratio of the CTE of the first insulation layer 410 to the CTE of the first conductor 310 may be lower than 3, and the shrinkage for the first insulation layer 410 or the first conductor 310 may be not enough such that the first conductor 310 cannot be inserted into the space 500 between the second conductor 320 and the third conductor 330. In some embodiments, a ratio of the CTE of the first insulation layer 410 to the CTE of the first conductor 310 may be greater than 7, and the adhesiveness between the first insulation layer 410 and the first conductor 310 may not stand or bear the shrinkage difference (or shear strength, or shear strain) between the first insulation layer 410 and the first conductor 310, such that delamination may occur between the first insulation layer 410 and the first conductor 310. Similar concern may exist between the second insulation layer 420 and the second conductor 320, or between the third insulation layer 430 and the third conductor 330.

Figure 4C:
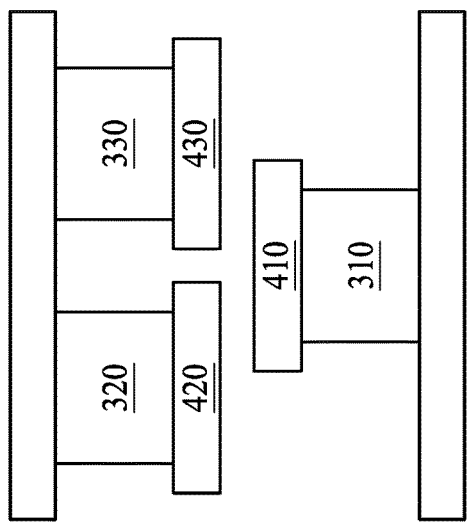
FIG. 4A, FIG. 4B, and FIG. 4C illustrate various embodiments for the conductor and insulation layer arrangement before bonding in accordance with some embodiments of the present disclosure.
Figure 4B:
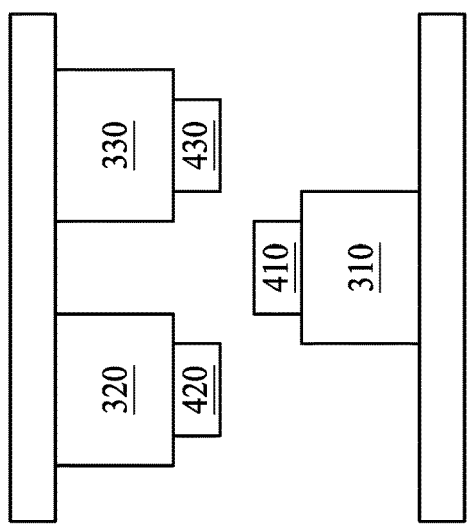
Figure 4A:
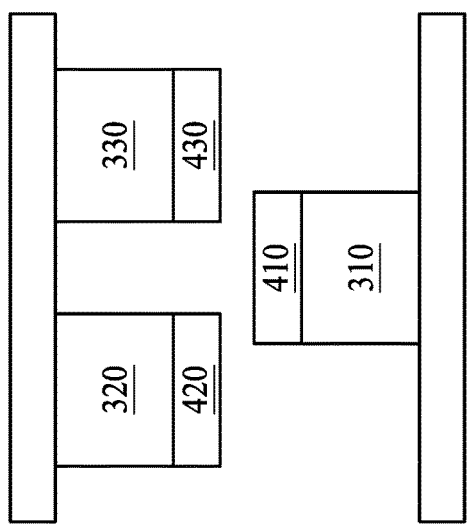

FIGS. 4A, 4B and 4C illustrate various embodiments for the conductor and insulation layer arrangement before bonding. As shown in FIGS. 4A, 4B and 4C, the first insulation layer 410, the second insulation layer 420, or the third insulation layer 430 may have an area that is same, shorter or longer than an area of the top surface of the corresponding first conductor 310, the second conductor 320, or the third conductor 330.

Figure 5A:
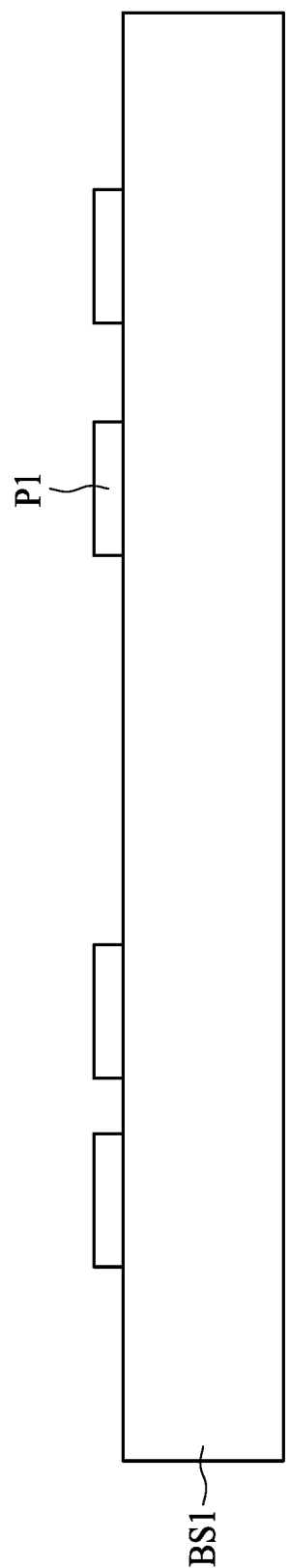
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, and FIG. 5N illustrate various stages of a method of manufacturing an electronic device in accordance with some embodiments of the present disclosure.
Figure 5B:
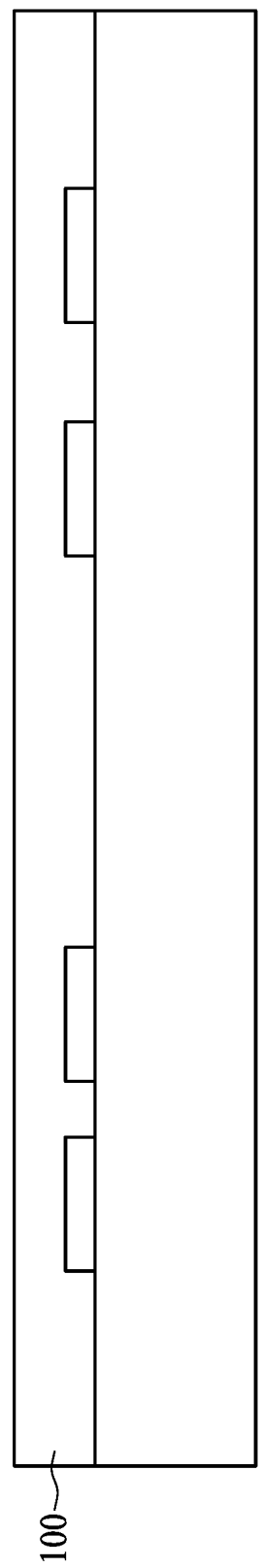
Figure 5C:
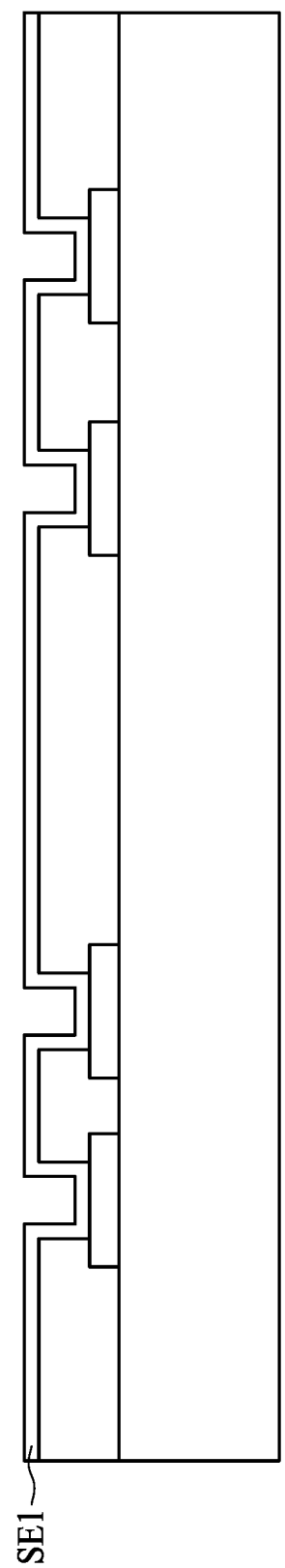
Figure 5D:
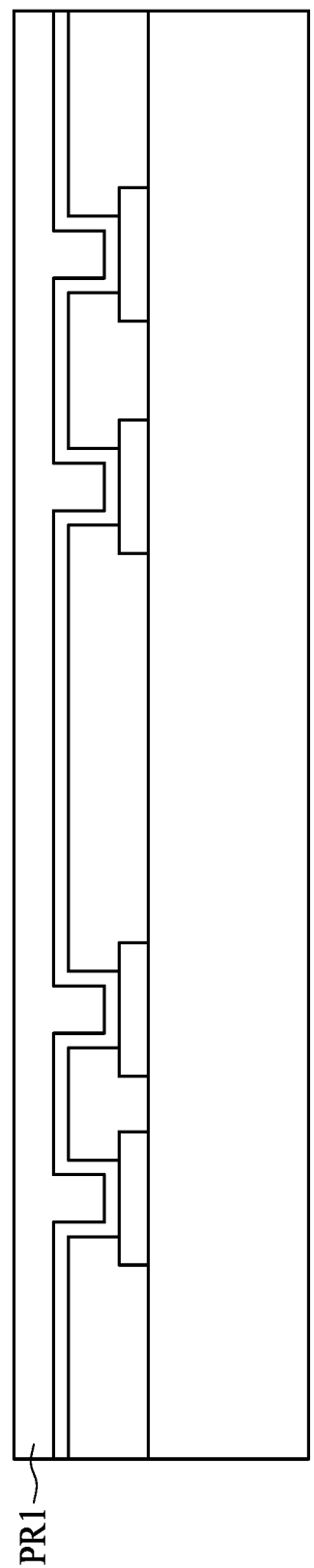
Figure 5E:
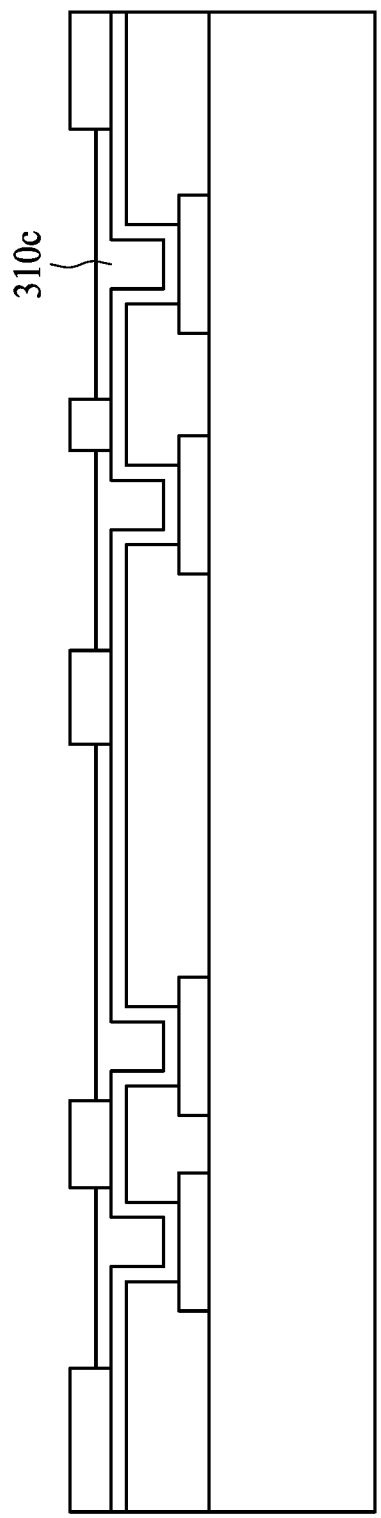
Figure 5F:
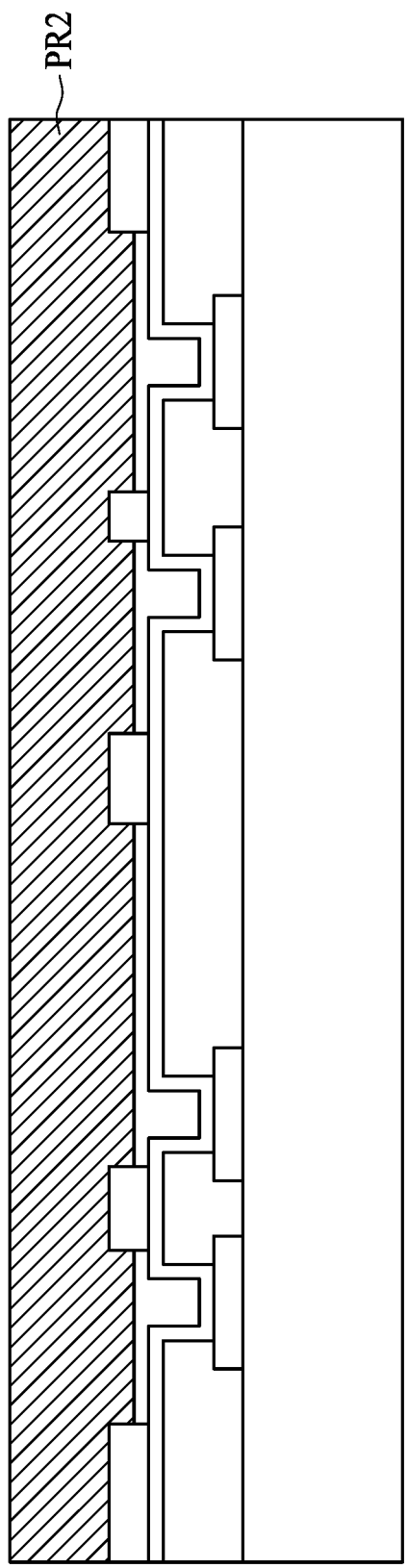
Figure 5G:
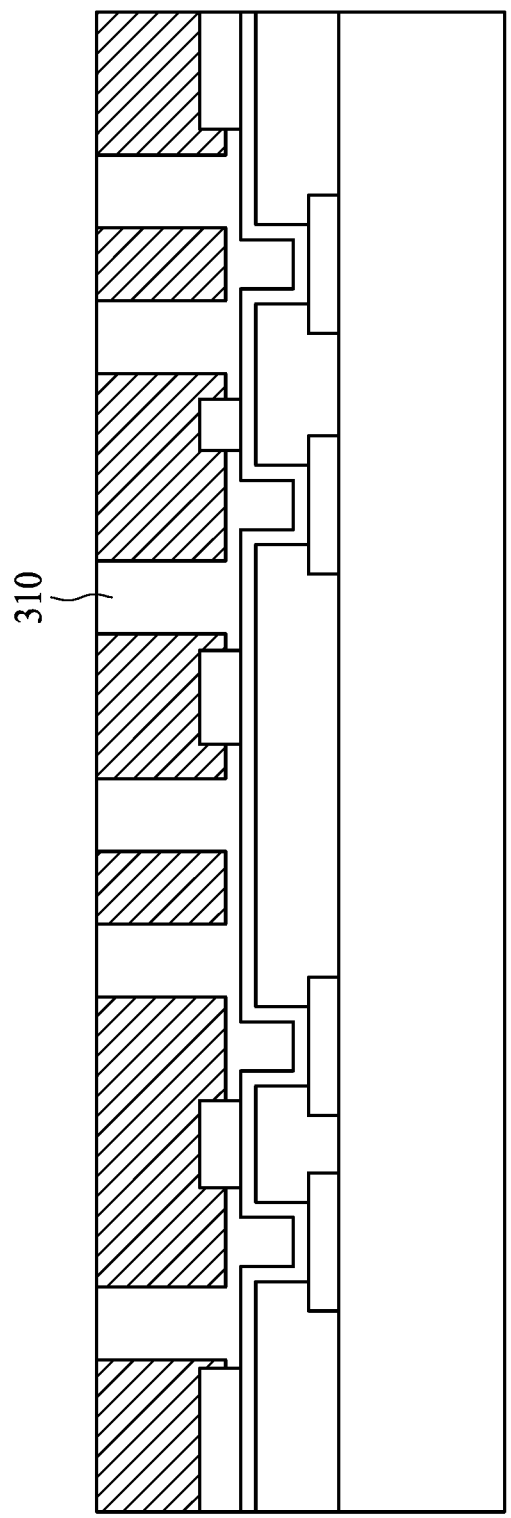
Figure 5H:
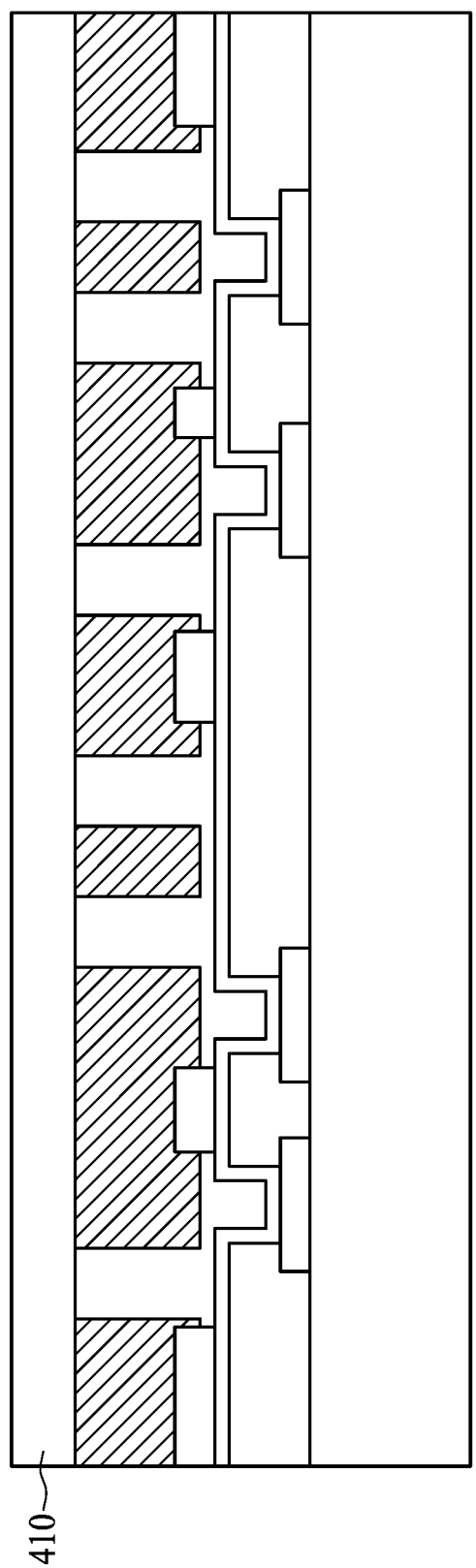
Figure 5I:
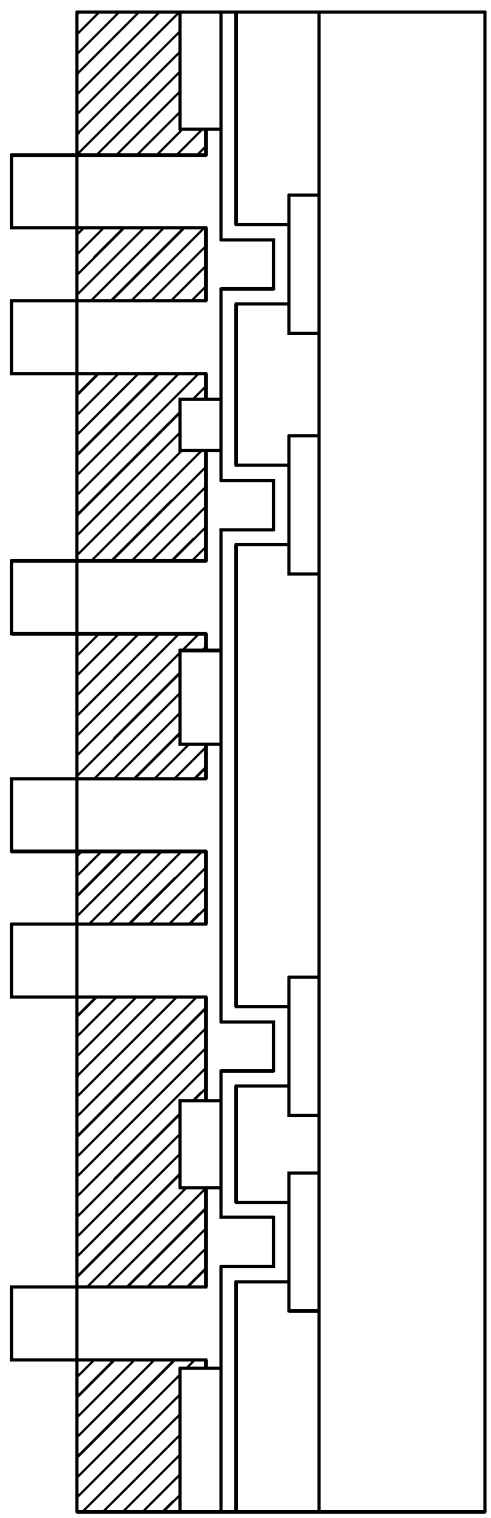
Figure 5J:
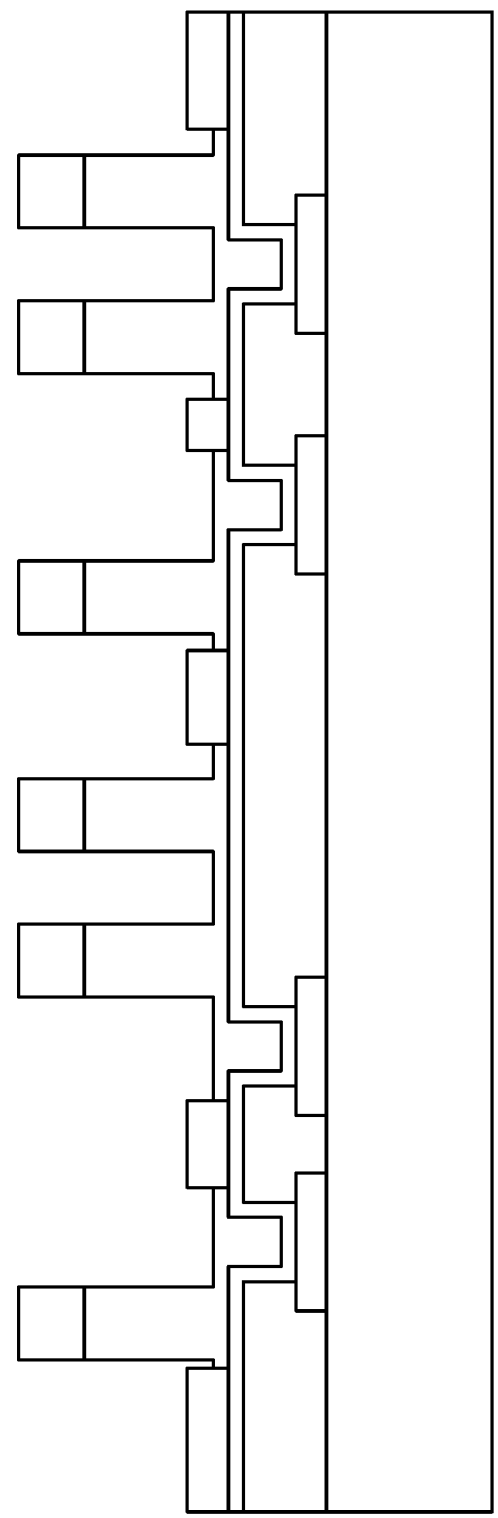
Figure 5K:
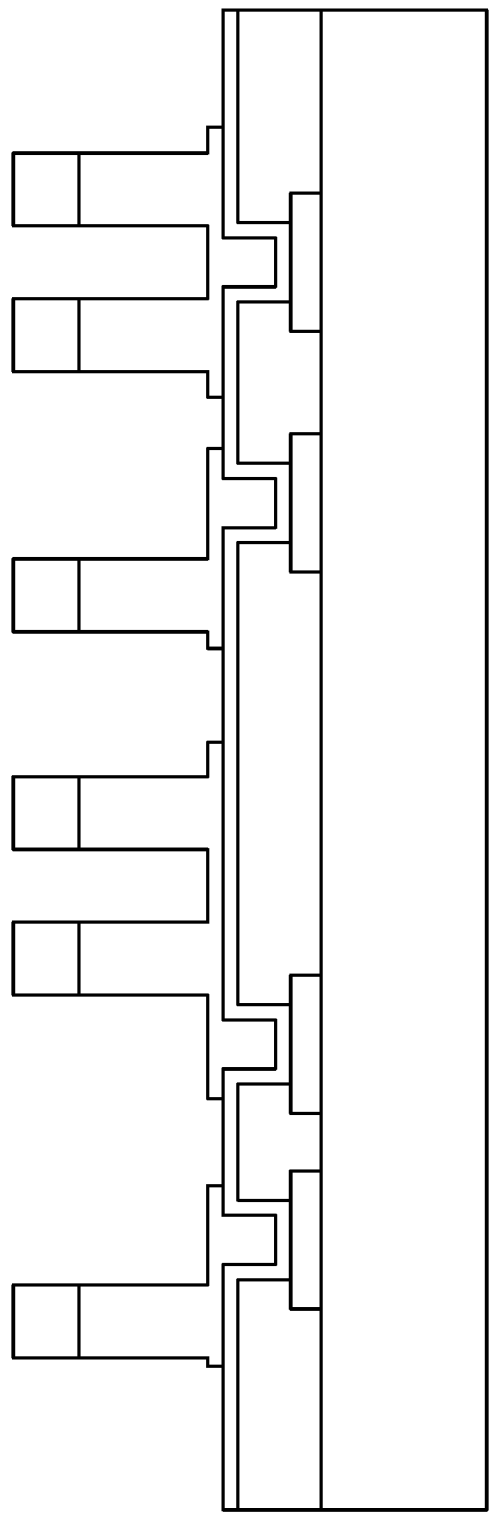
Figure 5L:
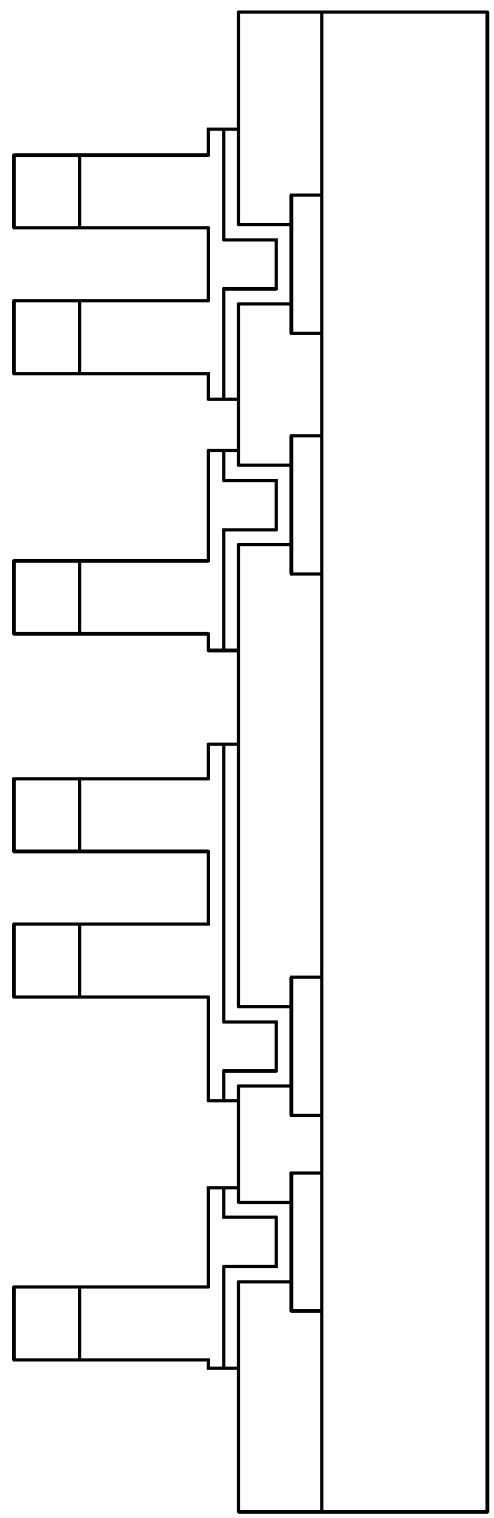
Figure 5M:
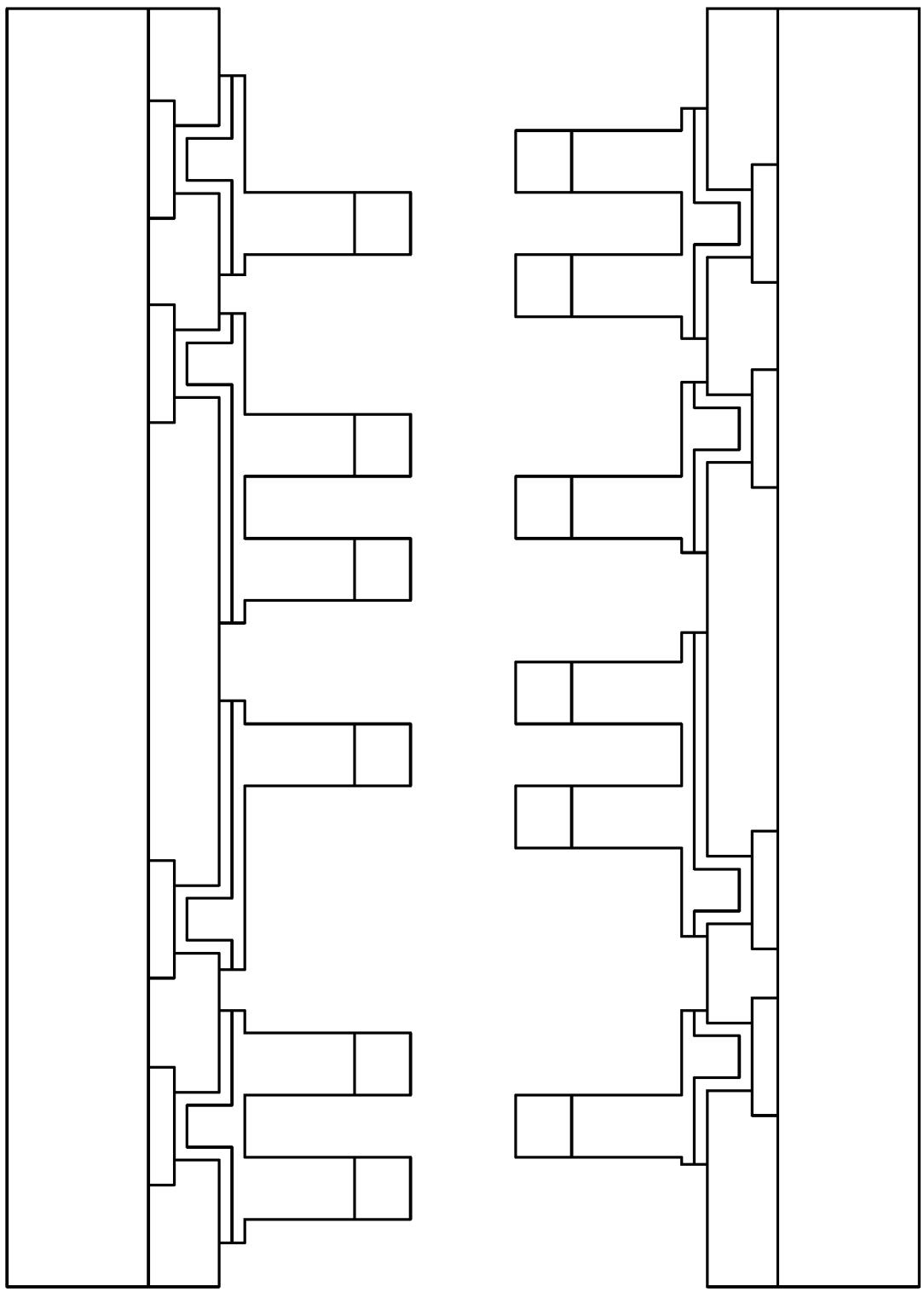
Figure 5N:
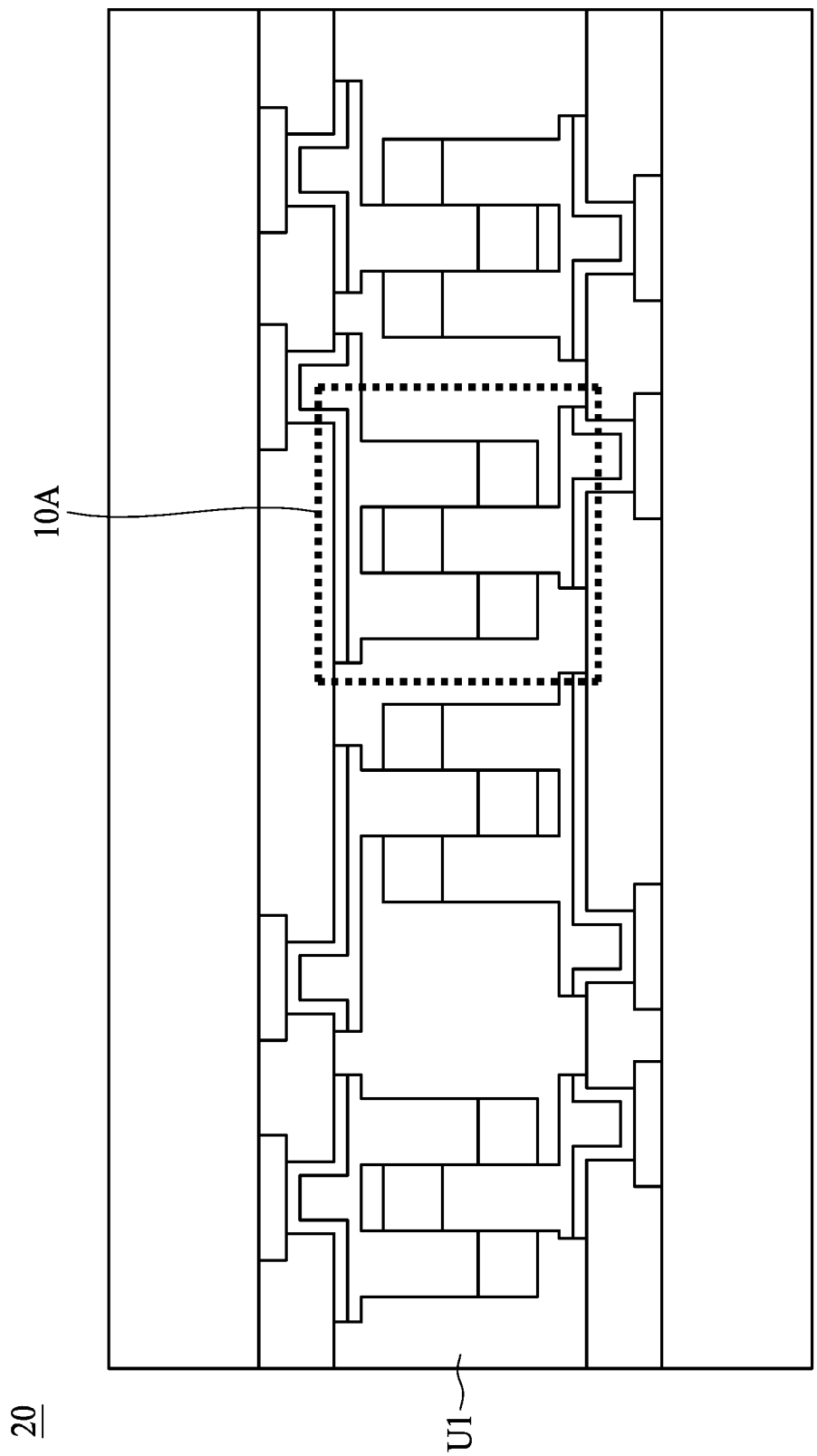

FIGS. 5A to 5N illustrate various stages of a method of manufacturing the electronic apparatus 20 in FIG. 2. In FIG. 5A, a base material BS1 (for example, a wafer, a panel or a chip) disposed with a pad P1 is provided. In FIG. 5B, a first substrate (for example, a PA or PI layer) 100 is coated or deposited on the base material BS1. A lithography process may be executed to expose the substrate 100. In FIG. 5C, the substrate 100 may be developed to form a plurality of openings thereon. A seed layer SE1 (for example, including Ti or Cu) may be formed on the substrate and within the openings by, for example, a physical vapor deposition (PVD) process. In FIG. 5D, a photoresist (PR) layer PR1 is coated on the seed layer SE1. A lithography process may be executed to expose the layer PR1. In FIG. 5E, the layer PR1 may be developed and a conductive layer 310c may be formed by, for example, plating. In FIG. 5F, another PR layer PR2 may be formed and exposed by a lithography process. In FIG. 5G, the layer PR2 may be developed to form a plurality of openings, and the openings are then filled with conductive materials to form conductors 310. In FIG. 5H, a first insulation layer 410 (for example, a high CTE PA layer) may be coated and exposed by a lithography process. In FIG. 5I, the first insulation layer 410 may be developed. In FIG. 5J, the layer PR2 may be removed. In FIG. 5K, the layer PR1 may be removed. In FIG. 5L, a portion of the seed layer SE1 may be removed by, for example, an etching process. In FIG. 5M, a bonding process such as the low-temperature bonding described for FIGS. 3A, 3B and 3C may be carried out. In FIG. 5N, an underfill U1 may be formed between two substrates to form the electronic apparatus 20 including the connection structure 10.

Figure 6:
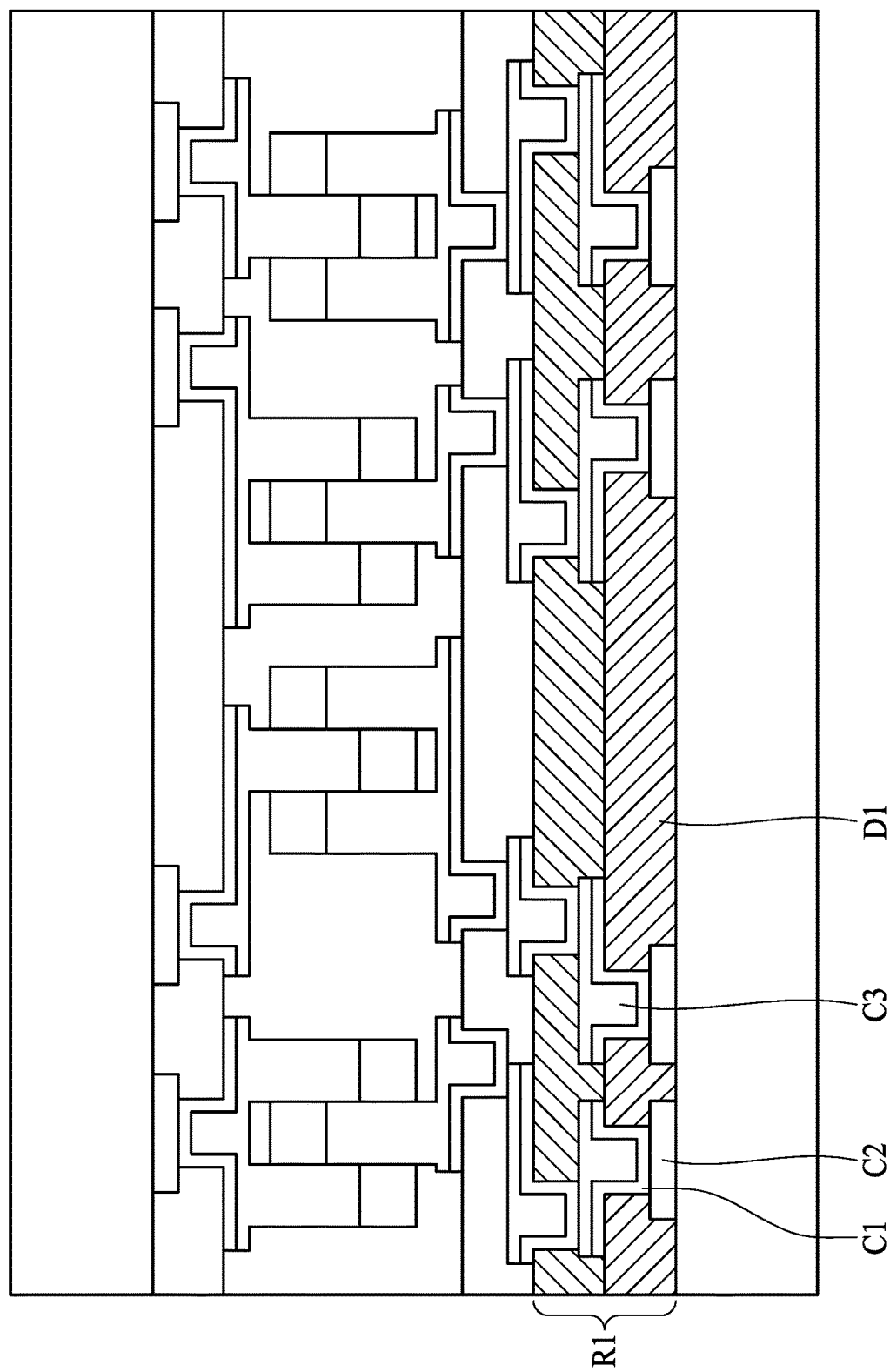
FIG. 6 illustrates an electronic apparatus in accordance with some embodiments of the present disclosure.

FIG. 6 illustrates an electronic apparatus 20A in accordance with some embodiments of the present disclosure. The electronic apparatus 20A is similar with the electronic apparatus 20 in FIG. 2. A difference between the electronic apparatus 20A and the electronic apparatus 20 is that the electronic apparatus 20A has a multilayer redistribution layer (RDL) R1. The RDL R1 may include a dielectric layer D1 and conductors C1, C2 or C3.

The first conductor 310, and the second conductor 320 or the third conductor 330 bonded with (or to be bonded with) the first conductor 310 may not be limited to the pattern or arrangement described above. FIGS. 7A and 7B illustrate various arrangements of conductors to be bonded from a top view perspective, in accordance with some embodiments of the present disclosure. The conductor M1 may correspond to and have similar properties with the first conductor 310 disposed on the first substrate 100 in FIG. 1A. The conductor M2 may correspond to and have similar properties with the second conductor 320 or the third conductor 330 disposed on the second substrate 200 in FIG. 1A. The insulation layer N1 may correspond to and have similar properties with the first insulation layer 410 in FIG. 1A. The insulation layer N2 may correspond to and have similar properties with the second insulation layer 420 or the third insulation layer 430 in FIG. 1A. For example, a CTE of the insulation layer N1 is greater than a CTE of the conductor M1, and a CTE of the insulation layer N2 is greater than a CTE of the conductor M2.

As shown in FIG. 7A, the conductor M1 may define a space inside and filled with the insulation layer N1. The insulation layer N2 may define a space inside and has an inner side and an outer side covered or in contact with the conductor M2. During the low temperature process described above, the combination of the conductor M1 and the insulation layer N1 is shrunk. The space inside the combination of the conductor M2 and the insulation N2 may expand due to the CTE difference between the conductor M2 and the insulation N2. The combination of the conductor M1 and the insulation layer N1 may be inserted into the space inside the combination of the conductor M2 and the insulation N2. During the temperature rise, the combination of the conductor M1 and the insulation layer N1 may expand, and the space inside the combination of the conductor M2 and the insulation N2 may decrease. Therefore, the conductor M1 and the conductor M2 (inside the insulation layer N2) are bonded together.

As shown in FIG. 7B, the conductor M2 may also define a space inside and filled with the insulation layer N2. In some embodiments, a combination of the conductor M1 and the insulation layer N1 may be inserted into a space between two combinations of the conductor M2 and the insulation N2 during a low temperature process During the temperature rise, the combination of the conductor M1 and the insulation layer N1 expand and the conductor M1 may be bonded with the two conductors M2.

Figure 8B:
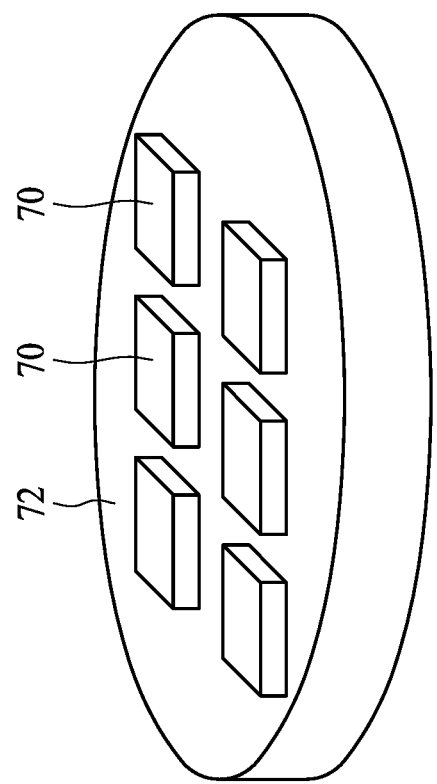
FIG. 8A and FIG. 8B illustrate various types of semiconductor package devices in accordance with some embodiments of the present disclosure.
Figure 8A:
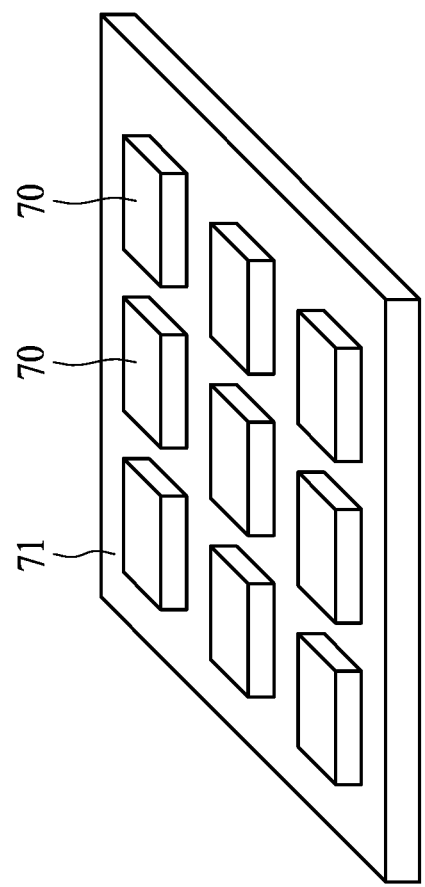

FIGS. 8A and 8B illustrate various types of semiconductor package devices in accordance with some embodiments of the present disclosure. The semiconductor package devices may be bonded with each other or may be bonded with an external device by a low temperature bonding process described above.

As shown in FIG. 8A, a plurality of chips 70 or dies are placed on a square-shaped carrier 71. In some embodiments, the carrier 71 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

As shown in FIG. 8B, a plurality of chips 70 or dies are placed on a circle-shaped carrier 72. In some embodiments, the carrier 72 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device, comprising:
   a first substrate having a first surface;
   a first conductor disposed on the first surface of the first substrate;
   a first insulation layer on the first conductor;
   a second substrate having a second surface facing toward the first surface of the first substrate;
   a second conductor disposed on the second surface of the second substrate; and
   a second insulation layer on the second conductor, wherein
   the first insulation layer is in contact with a sidewall of the second conductor;
   the second insulation layer is in contact with a sidewall of the first conductor; and
   a coefficient of thermal expansion (CTE) of the first insulation layer is greater than a CTE of the first conductor.

2. The electronic device of claim 1, wherein a CTE of the second insulation layer is greater than a CTE of the second conductor.

3. The electronic device of claim 1, wherein the first insulation layer comprises:
   a first surface in contact with the first conductor;

a second surface in contact with the sidewall of the second conductor; and
a third surface connecting the first surface and the second surface, wherein the third surface has a curve portion.

4. The electronic device of claim 1, wherein the second insulation layer comprises:
a first surface in contact with the second conductor;
a second surface in contact with the sidewall of the first conductor; and
a third surface connecting the first surface and the second surface, wherein
the third surface has a curve portion.

5. The electronic device of claim 1, wherein the first insulation layer has a first surface in contact with the second conductor, the second insulation layer has a second surface in contact with the first conductor, and an extension of the first surface of the first insulation layer and an extension of the second surface of the second insulation layer are substantially parallel and a distance therebetween is in a range from about 2 μm to about 20 μm.

6. The electronic device of claim 1, wherein a ratio of the CTE of the first insulation layer to the CTE of the first conductor is between about 3 to about 7.

7. The electronic device of claim 6, wherein the CTE of the first conductor is between about 16 ppm/° C. to about 18 ppm/° C., and the CTE of the first insulation layer is between about 60 ppm/° C. to about 100 ppm/° C.

8. The electronic device of claim 2, wherein a ratio of the CTE of the second insulation layer to the CTE of the second conductor is between about 3 to about 7.

9. The electronic device of claim 8, wherein the CTE of the second conductor is between about 16 ppm/° C. to about 18 ppm/° C., and the CTE of the second insulation layer is between about 60 ppm/° C. to about 100 ppm/° C.

10. The electronic device of claim 1, wherein the first insulation layer comprises polyimide.

11. The electronic device of claim 1, wherein a lattice in the vicinity of a boundary between the first conductor and the second conductor is smaller than a lattice away from the boundary.

12. An electronic device, comprising:
a first conductive post;
a first insulation layer disposed on the first conductive post;
a second conductive post adjacent to the first conductive post, the second conductive post and the first conductive post defining a gap therebetween;
a second insulation layer disposed on the second conductive post; and
a third conductive post disposed within the gap and in contact with a sidewall of the first conductive post and/or a sidewall of the second conductive post, wherein
a coefficient of thermal expansion (CTE) of the first insulation layer is greater than a CTE of the first conductive post.

13. The electronic device of claim 12, wherein the first insulation layer comprises:
a first surface in contact with the first conductive post;
a second surface in contact with a sidewall of the third conductive post;
a third surface connecting the first surface of the first insulation layer and the second surface of the first insulation layer; and
the third surface has a curve portion.

14. The electronic device of claim 12, wherein the first conductive post and the third conductive post define an overlapping portion in a range from about 2 μm to about 20 μm from a top view perspective.

15. The electronic device of claim 12, wherein a ratio of the CTE of the first insulation layer to the CTE of the first conductive post is between about 3 to about 7.

16. The electronic device of claim 12, wherein the CTE of the first conductive post is between about 16 ppm/° C. to about 18 ppm/° C., and the CTE of the first insulation layer is between about 60 ppm/° C. to about 100 ppm/° C.

17. The electronic device of claim 12, wherein the first insulation layer comprises polyimide.

18. The electronic device of claim 12, further comprising a third insulation layer on the third conductive post and in contact with the sidewall of the first conductive post and/or the sidewall of the second conductive post.

19. The electronic device of claim 12, further comprising a first lattice in the vicinity of a boundary between the first conductive post and the third conductive post and a second lattice farther away from the boundary between the first conductive post and the third conductive post than the first lattice, wherein the first lattice is smaller than the second lattice.

20. The electronic device of claim 12, wherein a ratio of a CTE of the second insulation layer to a CTE of the second conductive post is between about 3 to about 7.

* * * * *